Jan. 21, 1964 SHIGERU TSUJI 3,119,052

ENCLOSURES FOR SEMI-CONDUCTOR ELECTRONIC ELEMENTS

Filed Nov. 15, 1960

INVENTOR.
S. TSUJI
BY
Greene, Pineles & Durr
ATTORNEYS.

United States Patent Office 3,119,052
Patented Jan. 21, 1964

3,119,052
ENCLOSURES FOR SEMI-CONDUCTOR ELECTRONIC ELEMENTS

Shigeru Tsuji, Tokyo, Japan, assignor to Nippon Electric Company, Ltd., Tokyo, Japan, a corporation of Japan Filed Nov. 15, 1960, Ser. No. 69,383
Claims priority, application Japan Nov. 24, 1959
1 Claim. (Cl. 317—234)

This invention relates to enclosures for semi-conductor electronic elements such as semi-conductors, transistors, diodes, and like devices, and more particularly to semi-conductor elements which have to dissipate substantial energy in order to maintain them within their operative temperature range. Such semi-conductor devices are as a rule provided with a solid metallic base of a metal such as copper, which forms a heat-dissipating heat sink and provides in conjunction with a complementary enclosure wall, a hermetic enclosure for the semi-conductor element, one electrode of which is mechanically and electrically joined to the interior of the metal base. Electric resistance-welding is generally used for the hermetic sealing joints between metallic enclosure wall portions of such semi-conductor element. Since it is difficult to provide hermetic electric resistance-welding joints with copper, a ring plate of highly weldable metal such as iron, is first soldered to the junction region of the base plate for enabling subsequent hermetic junction of the complementary enclose wall portions by electric resistance-welding. The need for soldered joints introduces undesirable complexity and impurity problems into the manufacture of hermetically sealed enclosures for such high-heat-dissipation semi-conductor devices.

Among the objects of the invention is to provide hermetic enclosures for high-heat-dissipation semi-conductor devices, without soldered joints between complementary wall portions of the enclosure.

In accordance with the invention, high-heat-dissipation semi-conductor devices are provided with a hermetic enclosure which is free of any soldered joints, by providing the heat-dissipating base plate which is formed of high-conductivity metal such as copper, with a cladding of metal having a materially higher electric resistance than the base metal, and of sufficient thickness to enable forming of hermetic seals with complementary metallic wall portions by electric resistance-welding.

Figure 1:
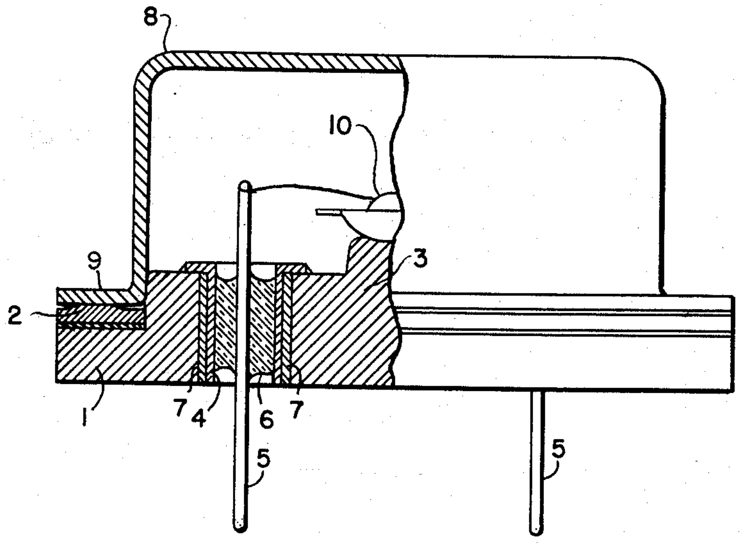
Figure 2:
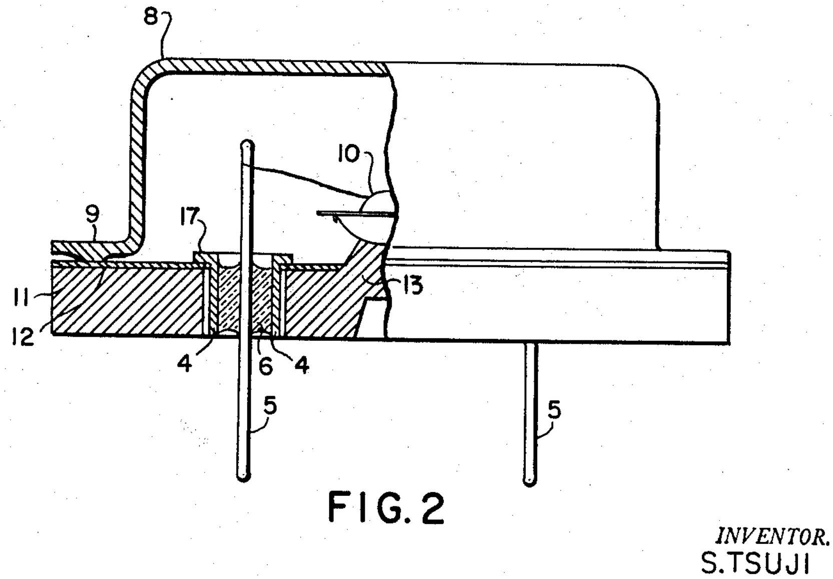

The foregoing and other objects of the invention will be best understood from the following description of an exemplification thereof, reference being had to the accompanying drawing, wherein:

FIG. 1 is an elevational view, partially in cross-section, of a conventional, prior-art semi-conductor device having a base plate which forms a heat-dissipating heat sink therefor; and FIG. 2 is a view similar to FIG. 1, of a semi-conductor device exemplifying one form of the invention.

The hermetic enclosures for large-capacity semi-conductor devices such as transistors and diodes, which must dissipate a relatively large amount of heat are, as a rule, made with a heat-dissipating heat-sink base plate of high-conductivity metal such as copper. In addition, the metallic heat-sink base plates are also used for insulatingly passing therethrough, sealed-through terminal conductors or wires to interior electrodes of the semi-conductor device, one electrode of which is electrically and mechanically untied to an interior surface portion of the heat-sink base plate.

FIG. 1 shows a known, conventional form of a hermetically enclosed, high-capacity semi-conductor device. A high-capacity electronic semi-conductor device 10 consisting, for instance, of a transistor having an emitter, base and collector, has one of its electrodes united in a conventional way to an inwardly-projecting base wall portion 3 of a relatively heavy metallic base plate 1 which forms the heat sink for dissipating heat losses developed in the operation of the semi-conductor device 10. Instead of a transistor, the semi-conductor device 10 may constitute a diode or any other of the known types of semi-conductor devices. To provide a hermetic enclosure for the semi-conductor device 10, the periphery of the metal base wall 1 has joined thereto a peripheral wall portion or flange 9 of a complementary enclosure wall 8 which in conjunction with the base wall 1, provides a hermetic enclosure for the semi-conductor device 10.

Because of the difficulties of making hermetic electric-resistance weld-joints with copper, a ring or loop-shaped plate 2 of highly weldable metal, such as iron, is first soldered to the peripheral surface of the base plate 1, to which metal ring 2 of the rim of enclosure wall 8 is then hermetically joined by resistance-welding. The heavy base plate 1 of copper is also used for sealing therethrough the metallic terminal leads or wires 5, through which external circuit connections are made to other electrodes of the semi-conductor device 10 within the enclosure shown. Such sealed-through metal leads 5 are held sealed-through within an insulating inorganic body 6 of glass, for instance, which is joined by fusion to the interior surfaces of a tubular wall portion of a metallic eyelet 4. The exterior surface of the metallic eyelet 4 is hermetically joined by solder 7 to the surrounding passage walls of the metallic base wall 1.

The need for soldered joints between complementary wall portions of the hermetic enclosure of such semi-conductor device, introduces undesirable complex operations in the manufacture of hermetically sealed enclosures for high heat-dissipation semi-conductor devices of the type above described.

The present invention eliminates the necessity for such soldered joints between complementary metal portions which provide the hermetic enclosure for high heat-dissipation semi-conductor devices. In accordance with the invention, the high heat-dissipating base plate, which is formed of high-conductivity metal such as copper, is provided with a sufficiently thick cladding of metal of materially higher electric resistance than the base metal, which makes it possible to join the complementary metallic enclosure walls to the base wall, and also a metallic portion of lead-in metallic sleeves, by resistance-welding to the metal cladding.

FIG. 2 shows, as an example, how a semi-conductor device 10 similar to that of FIG. 1, is provided with a hermetic, metallic, heat-dissipating wall enclosure which is free of soldered joints. In the device of FIG. 2, the base wall 11 is likewise formed of a highly efficient, heat-dissipating, heat-sink metal such as copper. One surface of base wall 11 has fused thereto a cladding 12 of high-weldable metal, such as iron. Out of a large sheet of such clad base metal, are cut or punched base-wall portions 11 of the required shape. An interior region of such base wall is deformed as shown, to provide an internally raised wall portion 13 to the interior surface of which is joined, in a conventional way, one electrode of the semi-conductor device 10, after first removing therefrom its cladded surface layer of high-resistance metal. The clad metal layer 12 is made of sufficient thickness to enable ready welding thereto by resistance-welding, of the flange 9 of the complementary enclosure wall 8, and also of the flanged portion 17 of the metallic eyelet 4 used for the sealed-through, lead-in conductors 5. The tubular body of the metallic eyelet 4 has hermetically fused thereto an inorganic insulating sealing body 6 holding sealed therein the terminal conductor lead 5. Only the flange or rim of the metallic eyelet 4 is hermetically joined to the base wall 11 by resistance-welding thereof to the underlying clad metal layer 12 of the base wall 11.

Since no soldering is required for forming the hermetically sealed enclosure of the high-capacity semi-conductor device of FIG. 2, there is no necessity for using soldering flux, and no danger of introducing impurities when providing an air-tight, hermetic seal around the semi-conductor device.

Furthermore, since the metallic eyelets of the sealed-through, insulating conductors are welded to the base wall 11 only at the eyelet rim, there is eliminated the danger of introducing disturbing stresses due to differences in the thermal expansion of the eyelet metal relatively to the metal of the base. There is also no danger of introducing a leak between the glass of the sealed-through leads 5 and the surrounding tubular wall portion of the metallic eyelet 4, because the resistance-welding heat is applied only to the rim of the eyelet 4 and the developed heat is conducted away into the large metal body of the base plate 11 without exposing the tubular wall portion of the eyelet 4 to excessive thermal expansion or contraction forces.

The base metal plate is clad with its higher-resistivity metal cladding 12 by any of the known procedures whereby the exposed surface of one metal is clad with a different metal. As an example, there may be used for this purpose the cladding process of the type described in "Welding Handbook," published by American Welding Society, Third Edition, on pages 802 to 831, and the publications listed therein; and also the cladding processes of the type described in "Metals Handbook," published by the American Society of Metals, 1948 Edition, the articles on pages 542 to 548, by Fitch, Grimshaw, Theisinget et al., and by Whitney, and the publications referred to therein; as well as in the book, "Resistance Welding in Mass Production," by A. J. Hipperson and T. Watson, published by Ibffe and Sons, Ltd., London, 1950, in "Industrial Electric Handbook," by Dr. D. Kretzmann, 1956, and in "Resistance Welding Theory and Use," prepared by Resistance Welding Committee, American Welding Society, 1956.

Among the methods of cladding the metal of high electrical conductivity with a layer of a metal exhibiting materially higher electrical resistance than the first-mentioned metal are (1) cold or heat pressure welding the first-mentioned metal and the second-mentioned metal and (2) brazing the second-mentioned metal on a relatively thick sheet of the first-mentioned metal and thereafter rolling the relatively thick brazed sheet. A large sheet of such clad base metal, "nickel-clad copper," for example, may be obtained at Sumitomo Kinzoku-kogyo K.K. (Sumitomo Metal Industry Co.), Osaka, Japan, or at Sin-kinzoku-kogyo K.K. (New Metal Industry Co.), Akasaka, Minatoku, Tokyo, Japan.

Without thereby limiting the scope of the invention, there are given below by way of example, data about practical embodiments of the invention:

The base plate 11 may be made of copper and copper alloys such as alloys of copper with zinc and also of other high-conductivity metals such as aluminium and their alloys.

The cladding metal 12 may be formed of iron and iron alloys, steel and an alloy of iron, nickel and cobalt and an alloy of iron and nickel; and pure nickel.

Good results are obtained by using a metal cladding of iron, having a thickness in the range of 0.2–0.3 mm.

The complementary enclosure wall 8 of the enclosure may be formed of any of the following metals: iron, an alloy of iron and nickel, or a very thinly copper-clad iron.

It will be apparent to those skilled in the art that the novel principles of the invention disclosed herein in connection with a specific exemplification thereof will suggest other modifications and applications of the same. It is accordingly desired that in construing the breadth of the appended claim, they shall not be limited to the specific exemplificatoins of the invention described herein.

I claim:

In combination with an electronic semi-conductor element having at least two semi-conductor electrodes that are to be maintained at different operating potentials, a container comprising a metallic base wall and a metallic cover wall joined to form a hermetic enclosure around said semi-conductor element, said base wall constituting a heat sink of substantial mass and being formed of a section of a clad metal sheet consisting of a thick metal layer having high electric conductivity and selected from the group consisting of copper, silver and their alloys, and a thin cladding layer facing the interior of said enclosure and united to one surface of said thick layer and having materially higher electric resistivity than said thick layer of the metal, said cladding layer being selected from the group consisting of iron, steel, nickel, cobalt and their alloys, the cladding layer having been removed from an intermediate portion of said base wall to expose the underlying high conductivity metal, one electrode of said semi-conductor element being electrically and mechanically affixed to said exposed base wall portion, the periphery of said cover wall being hermetically joined by electric-resistance welding to said cladding layer of said base wall, a metal eyelet having a tubular eyelet wall portion passing through a base passage to the exterior of said enclosure and a lateral projecting rim overlying said cladding layer, said rim being hermetically joined by resistance-welding to underlying portions of said cladding layer, said tubular eyelet wall being free to move and to expand and contract within the surrounding surface of its said base passage, and a metallic lead conductor connected to another semi-conductor electrode within said enclosure and passing through the interior and affixed with an electrically insulating and hermetically sealing body to the surrounding length of said tubular eyelet wall.

References Cited in the file of this patent

UNITED STATES PATENTS

| | | |
|---|---|---|
| 2,330,943 | Anderson et al. | Oct. 5, 1943 |
| 2,432,631 | Rosendale | Dec. 16, 1947 |
| 2,838,722 | Watson | June 10, 1958 |
| 2,984,774 | Race | May 16, 1961 |